US012584872B2

(12) United States Patent
Khemliche et al.

(10) Patent No.: US 12,584,872 B2
(45) Date of Patent: Mar. 24, 2026

(54) DEVICE FOR ANALYSING SURFACES USING FAST ATOM DIFFRACTION IN A HIGH-PRESSURE ENVIRONMENT

(71) Applicants: CENTRE NATIONAL DE LA RECHERCHE SCIENTIFIQUE, Paris (FR); UNIVERSITE PARIS-SACLAY, Gif-sur-Yvette (FR); CY CERGY PARIS UNIVERSITE, Cergy Pontoise (FR)

(72) Inventors: Hocine Khemliche, Viry Chatillon (FR); Anouchah Momeni, Boulogne Billancourt (FR); Tiberiu Minea, Paris (FR); Elena-Magdalena Staicu-Casagrande, Limours (FR); Sylvain Lupone, Saint Aubin (FR)

(73) Assignees: CENTRE NATIONAL DE RECHERCHE SCIENTIFIQUE, Paris (FR); UNIVERSITE PARIS-SACLAY, Gif-sur-Yvette (FR); CY CERGY PARIS UNIVERSITÉ, Cergy-Pontoise (FR)

( * ) Notice: Subject to any disclaimer, the term of this patent is extended or adjusted under 35 U.S.C. 154(b) by 167 days.

(21) Appl. No.: 18/566,853

(22) PCT Filed: Jun. 2, 2022

(86) PCT No.: PCT/EP2022/065007
§ 371 (c)(1),
(2) Date: Dec. 4, 2023

(87) PCT Pub. No.: WO2022/253939
PCT Pub. Date: Dec. 8, 2022

(65) Prior Publication Data
US 2024/0272098 A1      Aug. 15, 2024

(30) Foreign Application Priority Data

Jun. 4, 2021    (EP) ..................................... 21305760

(51) Int. Cl.
*G01N 23/2055* (2018.01)
*C23C 14/35* (2006.01)
(Continued)

(52) U.S. Cl.
CPC .......... *G01N 23/201* (2013.01); *C23C 14/35* (2013.01); *G01N 23/2055* (2013.01); *G01N 23/207* (2013.01)

(58) Field of Classification Search
CPC ............ G01N 23/201; G01N 23/2055; G01N 23/207; G01N 2223/105; G01N 2223/316;
(Continued)

(56) References Cited

U.S. PATENT DOCUMENTS

| | | | | | |
|---|---|---|---|---|---|
| 5,115,130 | A | * | 5/1992 | Suzuki | ................... G01N 23/20 250/251 |
| 2009/0114840 | A1 | * | 5/2009 | Ward | ...................... H01J 27/26 250/423 F |
| 2009/0250600 | A1 | * | 10/2009 | Khemliche | .......... G01N 23/207 250/251 |

FOREIGN PATENT DOCUMENTS

FR          2903494  A1      1/2008

OTHER PUBLICATIONS

Lucia "Production of ultra-high-vacuum chambers with integrated getter thin-film coatings by electroforming", Universite Bourgogne France-Comte, May 2019, p. 1-148 (Year: 2019).*
(Continued)

Primary Examiner — David J Makiya
Assistant Examiner — Mamadou Faye
(74) Attorney, Agent, or Firm — Maier & Maier, PLLC

(57) ABSTRACT
A device for characterizing a surface of a sample, including;
—a chamber comprising a medium for the sample, the
(Continued)

chamber being connected to a pump, referred to as the primary pump, suitable for maintaining a pressure below 10-2 mbar within the chamber; —a source for generating an incident beam of neutral atoms or molecules having an energy of between 50 eV and 5 keV, with a divergence less than or equal to 0.05°, the source being arranged to direct the incident beam within the chamber through an inlet to the surface to be characterized with an angle of incidence less than or equal to 10° relative to the plane of the surface.

9 Claims, 4 Drawing Sheets

(51) Int. Cl.
    *G01N 23/201*         (2018.01)
    *G01N 23/207*         (2018.01)

(58) Field of Classification Search
    CPC ................ C23C 14/35; H01J 37/32816; H01J
               37/32917; H01J 37/32935; H01J 37/3405
    See application file for complete search history.

(56)              References Cited

OTHER PUBLICATIONS

European Search Report and Written Opinion issued Nov. 17, 2021, in corresponding European Application No. 21 30 5760, 3 pages.
International Search Report issued Sep. 19, 2022, in corresponding International Application No. PCT/EP2022/065007, 4 pages.
Hofstadler S.A. et al., "Concentric Tube Vacuum Chamber for High Magnetic Field, High-Pressure Ionization in a Fourier Transform Ion Cyclotron Resonance Mass Spectrometer", Journal of the American Society for Mass Spectrometer, vol. 4, No. 2, Feb. 1, 1993, pp. 168-176, XP055855718, 10 pages.

* cited by examiner

DEVICE FOR ANALYSING SURFACES USING FAST ATOM DIFFRACTION IN A HIGH-PRESSURE ENVIRONMENT

FIELD

The present invention relates to a device for characterising surfaces. More particularly, the device of the invention makes it possible to determine the crystallographic structure of surfaces and to monitor growth of thin layers.

BACKGROUND

RHEED (Reflection High Energy Electron Diffraction) technique is the most widely used tool for characterising crystalline layers in situ. This technique has the advantage of being compatible with Molecular Beam Epitaxy (MBE), which is one of the most widely used methods for growing crystalline layers. The RHEED method enables the crystallographic structure of a surface to be fully characterised. It also enables the layer-by-layer growth of a crystal by MBE to be monitored in real time.

From document FR2903494, the characterisation of a crystallographic surface using a device that uses grazing incidence diffraction of neutral molecules or atoms is known. This technique, referred to as GIFAD (Grazing Incidence Fast Atom Diffraction), has many similarities with the RHEED tool. In addition to providing the same information about the structure of the crystalline layer as the RHEED method, the GIFAD method has several advantages related to the use of neutral particles:

exclusive sensitivity to the last layer of the surface, by virtue of a highly reduced penetration depth for neutral molecules or atoms compared with that of electrons, measurement based on the electron density profile rather than the position of the nuclei, insensitivity to electromagnetic fields, and the ability to operate without damage on fragile materials.

FIG. 1 schematically illustrates the device of document FR2903494. This device is a molecular epitaxy machine 1000 equipped with a GIFAD surface characterisation device. Machine 1000 consists of an enclosure 1100 connected to a pumping system 5 which produces an ultra-high vacuum in the enclosure. Effusion cells 1200, which produce molecular beams, open into the enclosure 1100. In front of these cells is located a support 1300 for a substrate 3' on which the surface 3 is to be epitaxially deposited. A means 1 of generating a high-energy atomic or molecular beam is adapted to emit into the enclosure 1100 via an inlet 1400. A position-sensitive detection means 4 consisting, for example, of a microchannel wafer coupled to a fluorescent screen observed by a camera is arranged in the wall of the enclosure 1100.

The beam 2 is directed towards a surface 3 to be characterised at a possibly variable angle of incidence $\theta_{inc}$ of no more than about 10° (grazing incidence). Here and in the following, the angles are measured relative to the plane of the target surface 3. As in the RHEED technique, the space directly above the surface 3 remains free, allowing molecular beam epitaxy growth simultaneously with the measurement.

The neutral molecules or atoms of the beam 2 are reflected by the surface 3, with a reflection angle $\theta_{ref} \approx \theta_{inc}$ undergoing diffraction in an azimuthal direction, i.e. parallel to the surface 3 due to the structure of the surface 3. In FIG. 2, the incident atomic or molecular beam is indicated by reference 2-i, the specular beam by 2-0 (as this is the "zero order" of diffraction) and the first non-specular beam by 2-1 (first order of diffraction). As in RHEED, the angle φ, formed by the projections onto a plane parallel to that of the surface 3 of the beam diffracted at the first order 2-1 and the beam diffracted at the zero order 2-0, is indirectly related to the lattice parameter a of the crystalline surface 3 in the transverse direction with respect to the movement of the incident atoms or molecules by the following relationship: d·tan φ=nλ, with n an integer and with d the period seen by the beam, which is related to a by a simple proportionality relationship that depends on the crystalline structure and the direction of observation. Thus, the angle φ=arctan(λ/d) is deduced for the first order of diffraction, where λ is the de Broglie wavelength of the incident particles. The diffraction pattern FD is then detected by detection means 4.

The GIFAD method set forth in document FR2903494 has proved its effectiveness for studying structure of surfaces and monitoring growth of thin films, especially in processes operating in a very low pressure chamber such as MBE. The GIFAD method of prior art operates at pressures ranging from $10^{-10}$ mbar to $10^{-5}$ mbar in the enclosure 1100, the limitation to this pressure range coming from two reasons:

the type of detector used (microchannel wafer coupled to a phosphor screen) for which the useful signal becomes difficult to operate when the pressure exceeds $10^{-5}$ mbar, and the need to preserve coherence of the atom beam as it travels through the enclosure by limiting probability of collision with the residual gas, otherwise the contrast of the fringes in the diffraction pattern is reduced and the pattern may consequently be inoperable.

However, some methods of thin film growth (such as magnetron plasma deposition, chemical vapour deposition or pulsed laser ablation), surface modification (plasma treatment or chemical modifications) or catalysis operate in a high-pressure environment (up to $10^{-2}$ mbar or beyond) and are therefore not compatible with the device of prior art.

The invention aims to overcome some of the limitations of prior art. To this end, one object of the invention is a device for characterising a surface of a sample by GIFAD wherein is implemented differential pumping of a detection enclosure, in which the diffraction pattern is detected. Thus, a pressure of less than $10^{-5}$ mbar, compatible with microchannel detection, is obtained within the detection enclosure, whereas the chamber comprising the sample can have a pressure of up to $10^{-2}$ mbar compatible with thin film growth or surface modification methods operating at high pressure.

SUMMARY

To this end, one object of the invention is a device for characterising a surface of a sample including:

a chamber comprising a support for said sample, said chamber being connected to a so-called primary pump adapted to maintain a pressure of less than $10^{-2}$ mbar within said chamber;

a source for generating an incident beam of neutral molecules or atoms having an energy of between 50 eV and 5 keV, with a divergence of less than or equal to 0.05°, said source being arranged to direct said incident beam within said chamber via an inlet and towards said surface to be characterised with an angle of incidence of less than or equal to 10° relative to the plane of said surface, the neutral molecules or atoms of said incident beam, forwardly scattered by said surface, forming a diffracted beam; and

a detection enclosure connected to said chamber and connected to a so-called UHVP pump comprising:

a set of concentric tubes, each tube having a so-called inlet end with an opening, said set comprising a smaller radius tube, having length L;

a position-sensitive detector adapted to detect a diffraction pattern of neutral molecules or atoms of said diffracted beam;

said length L and said openings being adapted to transport said diffracted beam to the detector without losing information on said surface, said openings and said UHVP pump being adapted to maintain a pressure of less than $10^{-5}$ mbar within the detection enclosure.

Advantageously, the opening of each tube has a diameter different from the others and decreasing as a function of the radius of the tubes.

Advantageously, a smaller diameter opening has a diameter of less than or equal to 5 mm.

Advantageously, a so-called high-pressure distance between said inlet and an inlet end of the tubes is less than a decoherence length of the incident beam and of the diffracted beam.

Advantageously, each tube has a so-called outlet end with a collar extending in a direction essentially perpendicular to the tubes so as to guide a gas stream in this direction at the outlet of each tube, a coupling port of said UHVP pump being disposed in said detection enclosure facing a space formed by said collars.

Advantageously, said detector comprises a wafer of microchannels coupled to a fluorescent screen observed by a camera.

Advantageously, said source is adapted so that said angle of incidence can be varied, said device also comprising a translation and/or rotation stage for said set of tubes so as to adjust position of said openings as a function of said angle of incidence.

Another object of the invention is a system for magnetron plasma deposition comprising a device according to the invention arranged to characterise said surface of the sample while being deposited.

BRIEF DESCRIPTION OF THE FIGURES

Other characteristics, details and advantages of the invention will become apparent upon reading the description made with reference to the appended drawings given by way of example and which represent, respectively.

In the figures, unless otherwise indicated, the elements are not to scale.

4

DETAILED DESCRIPTION

Figure 1:
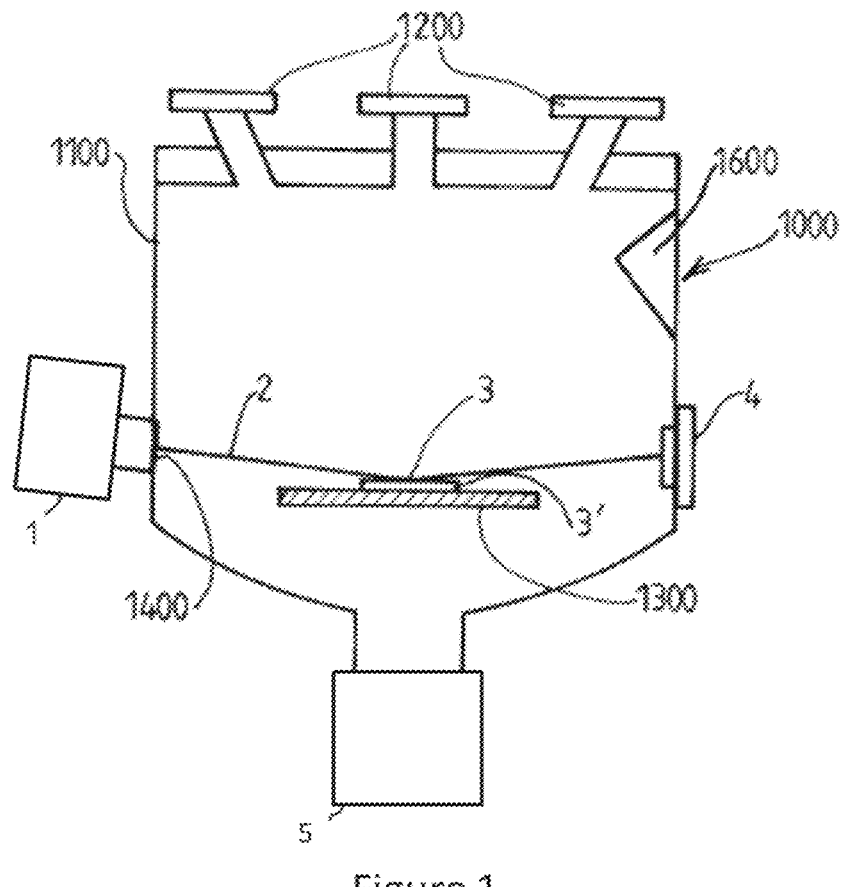
FIG. 1, a schematic view of a device for characterising a surface of a sample using the GIFAD technique according to prior art, FIG. 2, an illustration of the diffraction of the incident atomic or molecular beam by the surface of a sample using the GIFAD technique according to prior art, FIG. 3, a schematic view of a device according to the invention for characterising the surface of a sample using the GIFAD technique, FIG. 4, an enlarged schematic view of the enclosure ZDU of the device of the invention, FIG. 5, a schematic view of a magnetron plasma deposition system comprising a device according to the invention for characterising the surface of the sample by the GIFAD technique while being deposited.
Figure 2:
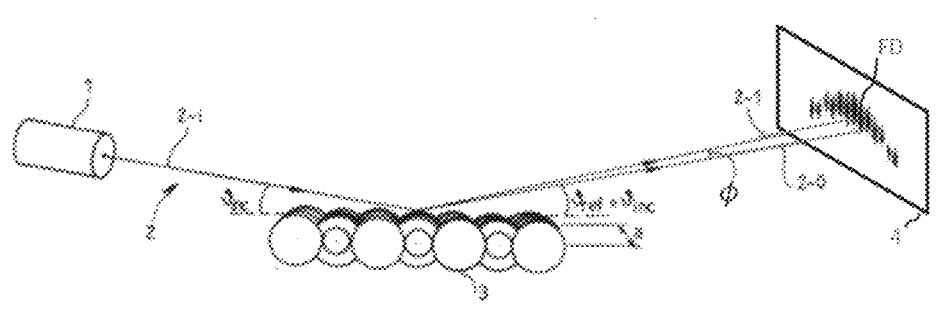
Figure 3:
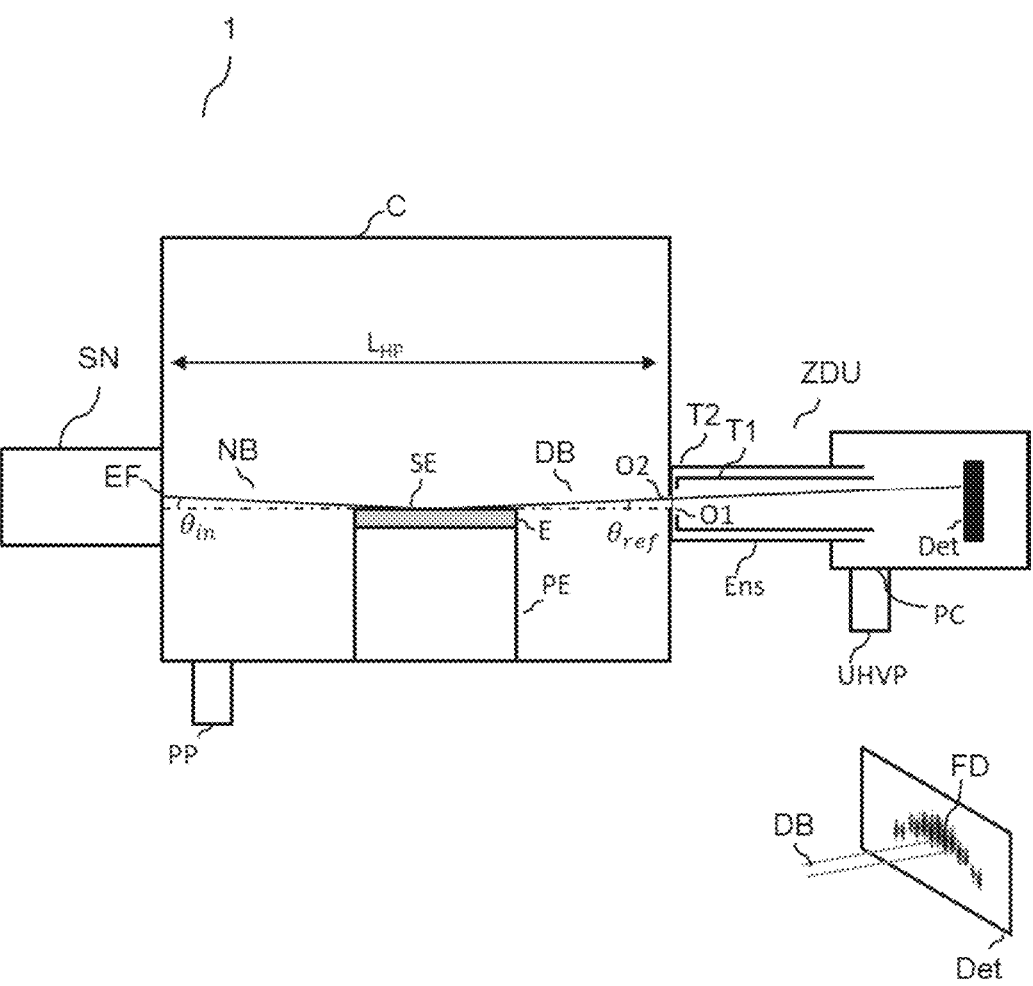

FIG. 3 illustrates a device 1 according to the invention, for characterising a surface SE of a sample E by the GIFAD technique. The device comprises a chamber C comprising a support PE for the sample E.

Device 1 comprises a source SN for generating an incident beam NB of neutral molecules or atoms having an energy of between 50 eV and 5 keV, with a divergence of less than or equal to 0.05°. This source is known from prior art and is described in more detail in document FR2903494. For the sake of brevity, therefore, its description will not be repeated here. It is simply noted that it typically comprises three stages: a generator of an atomic or molecular ion beam, a neutraliser and a collimator. The ion source comprises a set of electrodes enabling the ions to be accelerated to the desired energy by the application of an electrostatic field, as well as electrostatic focusing optics. The electric charge of the ions enables them to be accelerated, selected and, if required, generated into a pulsed beam much more easily than neutral particles. The ion beam is then neutralised by charge exchange in a gas-filled cell. The atomic or molecular beam leaving the neutraliser generally has too high a divergence for diffraction by the target surface SE to be possibly observed, and should therefore be collimated using the collimator, typically consisting of a pair of diaphragms.

In the device of the invention, the source SN is arranged to direct the incident beam NB within the chamber C via an input EF. This beam NB is directed towards the surface SE to be characterised under grazing incidence conditions, that is with an angle of incidence $\theta_{in}$ of less than or equal to 10° with respect to the plane of the surface. This grazing incidence condition ensures minimal penetration of neutral molecules or atoms within the sample and therefore sensitivity to the last layer of the sample. On the other hand, an angle of incidence that is too high significantly degrades the diffraction signal. As explained thereabove, the neutral molecules or atoms in the incident beam NB are forwardly scattered by the surface SE, with a reflection angle $\theta_{ref}{\approx}\theta_{inc}$ undergoing diffraction in an azimuthal direction due to the crystallographic structure of the surface. The neutral molecules or atoms of the incident beam NB forwardly scattered thus form a diffracted beam DB transporting the characteristic spatial information of the surface SE as a far-field diffraction pattern FD. FIG. 3 comprises an illustration in a perspective view of the detector Det and the diffraction pattern FD.

Unlike the characterisation device by the GIFAD technique of prior art, in which detection was carried out in the chamber pumped at a pressure of less than $10^{-5}$ mbar, the device 1 of the invention implements differential pumping of a detection enclosure ZDU in which detection of the diffraction pattern is carried out, separate from chamber C. As a reminder, by differential pumping it is intended the technique consisting of juxtaposing several different volumes between which a high pressure difference is maintained, the volumes being separated by a small dimension opening and being pumped by a respective pump. Specifically, in the invention, chamber C and enclosure ZDU are connected by several separate volumes, the volumes being pumped by a so-called UHVP (see below). In this way, a pressure of less than $10^{-5}$ mbar, compatible with detection by wafer of microchannels, is obtained within the detection enclosure ZDU, whereas chamber C containing the sample E can have a pressure of up to $10^{-2}$ mbar (hereinafter "high pressure") compatible with thin film growth or surface modification methods operating at high pressure.

To this end, the chamber C is connected to a so-called primary pump PP via a coupling port (not represented), the pump PP being adapted to maintain a pressure of less than $10^{-2}$ mbar within chamber C. Preferentially, the chamber C is pumped by the primary pump PP and an additional turbomolecular pump. This configuration is justified by the need, excluding gas injection, to maintain ultra-high vacuum (pressure below $10^{-9}$ mbar) in order to preserve sample quality, as the GIFAD technique is extremely sensitive to surface contamination.

To perform differential pumping, the detection enclosure ZDU is connected to chamber C, and is connected to the UHVP pump via a coupling port PC. The PP and UHVP pumps are typically turbomolecular pumps. The enclosure ZDU comprises a set of concentric tubes Ens, each tube T1, T2 having a so-called inlet end with a respective opening O1, O2 placed in proximity to the sample E. The set of tubes makes it possible to define juxtaposed volumes separating the chamber and the environment surrounding the detector Det by small-diameter openings in order to perform differential pumping. The diameter of the openings O1, O2 and the pump UHVP are adapted to maintain a pressure of less than $10^{-5}$ mbar within the detection enclosure ZDU.

Figure 4:
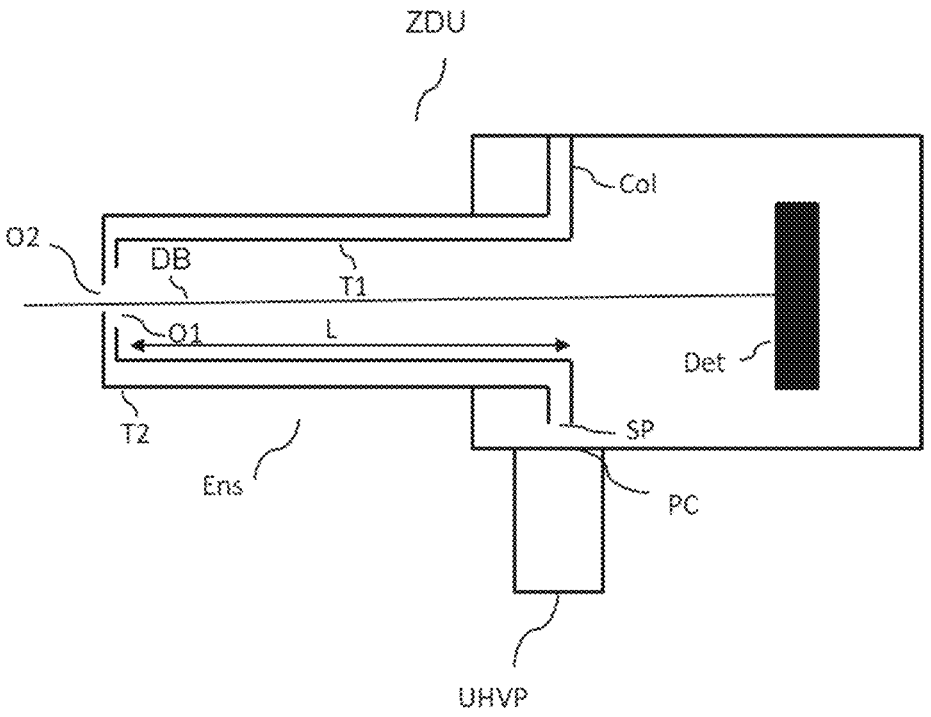

FIG. 4 shows a schematic illustration of the enclosure ZDU enlarged in relation to FIG. 3.

In order to carry out detection, the enclosure ZDU comprises the position-sensitive detector Det adapted to detect the diffraction pattern FD of the neutral molecules or atoms of the diffracted beam FD. For example, the detector consists of a wafer of microchannels coupled to a fluorescent screen observed by a camera.

Differential pumping thus makes it possible to ensure a vacuum of less than $10^{-5}$ mbar in the enclosure ZDU, guaranteeing a signal-to-noise ratio of the diffraction pattern on the detector that is sufficient to determine the surface structure, while having a high pressure (up to $10^{-2}$ mbar) in the chamber C. The invention therefore provides a viable solution to the lack of a tool capable of monitoring growth in magnetron plasma deposition frames, a technique operating at high pressure and widely used in research and industry, and for which the RHEED is unusable due to the intensity of the electromagnetic fields present in the chamber during deposition.

It is essential that the path of the diffracted beam between the sample and the detector Det is without loss of information, that is without part of the diffraction pattern FD, relevant for characterising the surface SE, being cut off by the path in the set of tubes Ens. In the device of the invention, the diffracted beam is transported in the smaller radius tube T1, having length L. Also, the aforementioned condition amounts to saying that the length L and the openings O1, O2 are adapted to transport the diffracted beam to the detector Det without losing information. For this, the openings at the ends of the tubes have progressively larger diameters along the path of the diffracted beam DB, decreasing as a function of the radius of the tubes. That is, the larger radius tube T2 has a smaller diameter opening O2 and is placed closer to the sample than the opening O1 of the smaller radius tube T1. Indeed, the diffracted beam DB diverges from the sample and the openings should adapt to this divergence. By way of non-limiting example, in order not to truncate the relevant diffraction signal while allowing differential pumping to a pressure of less than $10^{-5}$ mbar in the detection enclosure, the smaller diameter opening O2 typically has a diameter of less than or equal to 5 mm when the distance between the sample and the opening is typically 5 cm.

Preferentially, the openings O1 and O2 are sufficiently large in diameter for the diffraction pattern detected to include all the intensity scattered by the surface but also part of the direct beam (not diffracted by the surface). The latter serves as an angular reference and is advantageous for the correct interpretation of diffraction diagrams.

In the device of the invention, the probability of collision of the atoms or molecules of the beams DB and NB with the residual gas in the chamber C is higher than for the GIFAD device of prior art, given the higher pressure in the chamber C. These collisions lead to an exchange of angular momentum and/or energy which may destroy coherence of the atom or molecule beam, thus reducing contrast of the fringes of the diffraction pattern. In order to obtain an operable diffraction diagram FD on the detector Det, in the invention, a so-called high-pressure distance LHP between the inlet EF and the opening O2 is less than a decoherence length of the incident beam. It is understood that this decoherence length depends on the energy of the atoms or molecules in the beams DB and NB and on the pressure in the chamber C. By way of example, by means of simulations, the inventors have calculated that a high-pressure distance LHP of less than 10 cm for a pressure of approximately $10^{-2}$ mbar within the chamber C for an energy of approximately 1 keV makes it possible to guarantee partial conservation of the quantum character of the atom or molecule beam and to obtain an operable diffraction pattern. It is noted that this distance is more than sufficient to allow integration of a surface treatment system (deposition or etching) within the chamber C.

In the device of FIGS. 3 and 4, by way of a non-limiting example, only two tubes are represented, but it is understood that the invention can be implemented with more than two tubes. The use of more than two tubes makes it easier to maintain a large pressure difference between the chamber C and the enclosure ZDU while transporting the beam DB without loss of information on the surface SE, carried by the diffraction pattern FD.

In the device of FIG. 4, according to one embodiment, each tube has a so-called "outlet" end with a collar Col extending in a direction essentially perpendicular to the tubes so as to guide a gas stream, pumped by the pump UHVP, in this direction at the outlet of each tube. Furthermore, the coupling port PC of the UHVP pump is disposed in the detection enclosure facing a space SP formed by the collars. These optional characteristics ensure that the presence of residual gas in the enclosure ZDU in the immediate environment of the detector is minimal.

Preferentially, according to one embodiment of the invention, the generation source SN is adapted so that said angle of incidence $\theta_{inc}$ can be varied. The variation of the angle of incidence $\theta_{inc}$ implies a same variation of the angle of reflection $\theta_{ref}$. In order to transport the diffracted beam without loss of spatial information, the device also comprises a translation and/or rotation stage (not represented in FIG. 4) of the set of tubes so as to adjust position of the openings as a function of the angle of incidence.

Figure 5:
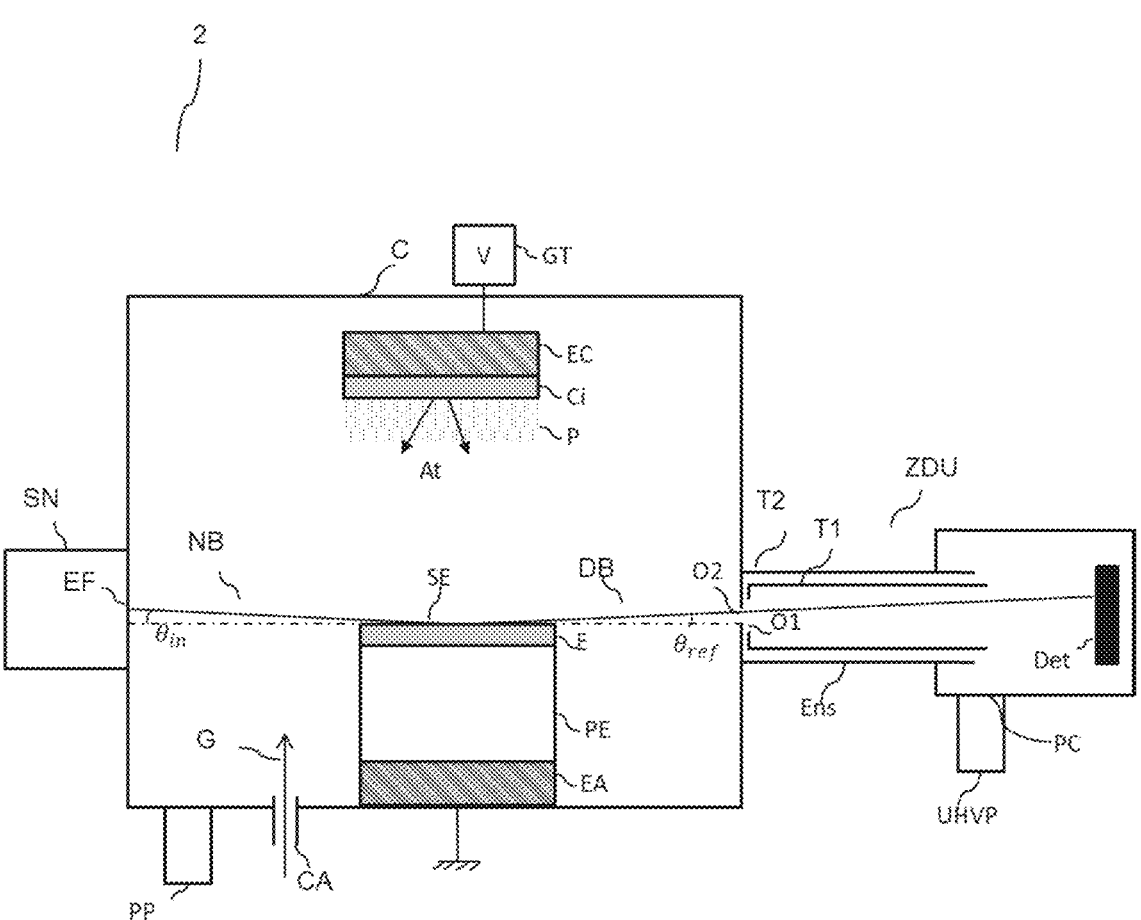

FIG. 5 illustrates a system 2 for magnetron plasma deposition comprising a device according to the invention for characterising the surface SE of the sample E by the GIFAD technique during its deposition. In comparison with the device of the invention illustrated in FIG. 3, the system 2 further comprises a channel CA for supplying the gas G from which the plasma P, for example argon, will be generated. The system also comprises two electrodes between which a voltage is applied using a voltage generator GT: a magnetron cathode EC and an anode EA (illustrated here as connected to the ground). The voltage between the anode EA and the cathode EC enables a ionisation cascade by gas impact and generation of plasma P. It is because of the intensity of the electromagnetic fields present in the chamber during deposition that the RHEED is unusable for in situ monitoring of this technique. The use of a magnetron-type magnetic trap, for example, coupled to the cathode EC makes it possible to confine electrons in the plasma P in proximity to the surface of the target Ci in order to increase density of the plasma, but also to enable it to operate below $10^{-2}$ mbar, which is perfectly compatible with the device described in the invention. Ions of the gas G are then accelerated towards the cathode and then impact the surface of the target Ci, ejecting atoms At from the target with sufficient kinetic energy for them to reach the surface of the sample, thereby forming the layer SE.

Because of the presence of the gas G and the plasma, the pressure in the chamber C is typically between $10^{-3}$ mbar and $10^{-2}$ mbar during magnetron plasma deposition. By virtue of the differential pumping of the device of the invention, it is possible to implement the GIFAD technique during magnetron plasma deposition.

The invention claimed is:

1. A device for characterizing a surface of a sample comprising:

a chamber comprising a support for said sample, said chamber being connected to a primary pump adapted to maintain a pressure of less than 10-2 mbar within said chamber;

a source for generating an incident beam of neutral molecules or atoms having an energy of between 50 eV and 5 keV, with a divergence of less than or equal to 0.05°, said source being arranged to direct said incident beam within said chamber via an inlet and towards said surface to be characterized with an angle of incidence of less than or equal to 10° relative to the plane of said surface, the neutral molecules or atoms of said incident beam, forwardly scattered by said surface, forming a diffracted beam; and a detection enclosure connected to said chamber and connected to a so-called UHVP pump comprising:

a set of concentric tubes, each tube having an inlet end with an opening, said set comprising a smaller radius tube, having length L;

a position-sensitive detector adapted to detect a diffraction pattern of neutral molecules or atoms of said diffracted beam;

said length L and said openings being adapted to transport said diffracted beam to the detector without losing information on said surface, said openings and said UHVP pump being adapted to maintain a pressure of less than 10-5 mbar within the detection enclosure.

2. The device according to claim 1, wherein said opening of each tube has a diameter different from the others and decreasing as a function of a radius of the tubes.

3. The device according to claim 1, wherein a smaller diameter opening has a diameter of less than or equal to 5 mm.

4. The device according to claim 1, wherein a so-called high pressure distance between said inlet and an inlet end of the tubes is less than a length of decoherence of the incident beam and the diffracted beam.

5. The device according to claim 4, wherein said high pressure distance is less than 10 cm.

6. The device according to claim 1, wherein each tube has a so-called outlet end with a collar extending in a direction essentially perpendicular to the tubes so as to guide a gas stream in this direction at the outlet of each tube, a coupling port of said UHVP pump being disposed in said detection enclosure facing a space formed by said collars.

7. The device according to claim 1, wherein said detector comprises a wafer of microchannels, coupled to a fluorescent screen observed by a camera.

8. The device according to claim 1, wherein said generation source is adapted so that said angle of incidence can be varied, said device also comprising a translation and/or rotation stage for said set of tubes so as to adjust a position of said openings as a function of said angle of incidence.

9. A magnetron plasma deposition system comprising a device according claim 1, arranged to characterize said surface of the sample while being deposited.

* * * * *